US012439809B2

(12) United States Patent
Lee et al.

(10) Patent No.: US 12,439,809 B2
(45) Date of Patent: Oct. 7, 2025

(54) DISPLAY PANEL COMPRISING CONDUCTIVE TAPE

(71) Applicant: LG Display Co., Ltd., Seoul (KR)

(72) Inventors: Junjae Lee, Paju-si (KR); Myeongah Shin, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 409 days.

(21) Appl. No.: 17/988,607

(22) Filed: Nov. 16, 2022

(65) Prior Publication Data

US 2023/0217683 A1    Jul. 6, 2023

(30) Foreign Application Priority Data

Dec. 30, 2021   (KR) .................. 10-2021-0192362

(51) Int. Cl.
*H10K 50/842*   (2023.01)
*H10K 50/80*    (2023.01)
*H10K 50/86*    (2023.01)
*H10K 50/87*    (2023.01)
*H10K 102/00*   (2023.01)

(52) U.S. Cl.
CPC ....... *H10K 50/8426* (2023.02); *H10K 50/865* (2023.02); *H10K 50/868* (2023.02); *H10K 50/87* (2023.02); *H10K 2102/311* (2023.02)

(58) Field of Classification Search
None
See application file for complete search history.

(56) References Cited

U.S. PATENT DOCUMENTS

| | | | |
|---|---|---|---|
| 2018/0321779 A1* | 11/2018 | Huang | G06F 3/0412 |
| 2023/0059283 A1* | 2/2023 | Park | G06F 1/1637 |
| 2023/0170453 A1* | 6/2023 | Lee | H10K 59/126 |
| | | | 257/79 |
| 2023/0180507 A1* | 6/2023 | Lee | H10K 50/84 |
| | | | 257/40 |
| 2023/0189548 A1* | 6/2023 | Park | H10K 59/87 |
| | | | 257/40 |
| 2023/0209792 A1* | 6/2023 | Son | H10K 50/841 |
| | | | 361/220 |
| 2023/0209793 A1* | 6/2023 | Shin | G02F 1/133331 |
| | | | 361/220 |

FOREIGN PATENT DOCUMENTS

| | | |
|---|---|---|
| KR | 10-2019-0043766 A | 4/2019 |
| KR | 10-2020-0083697 A | 7/2020 |
| KR | 10-2021-0030145 A | 3/2021 |
| KR | 10-2021-0081953 A | 7/2021 |
| KR | 10-2021-0101428 A | 8/2021 |

* cited by examiner

*Primary Examiner* — Daniel Whalen
(74) *Attorney, Agent, or Firm* — Birch, Stewart, Kolasch & Birch, LLP

(57) ABSTRACT

A display panel is provided, which is capable of removing a Greenish phenomenon by preventing a shift phenomenon arising inside a panel layer by improving conductivity of a component disposed at an upper portion of the panel layer. The display panel can include a cover window, the panel layer disposed below the cover window, and a support member disposed below the panel layer.

15 Claims, 14 Drawing Sheets

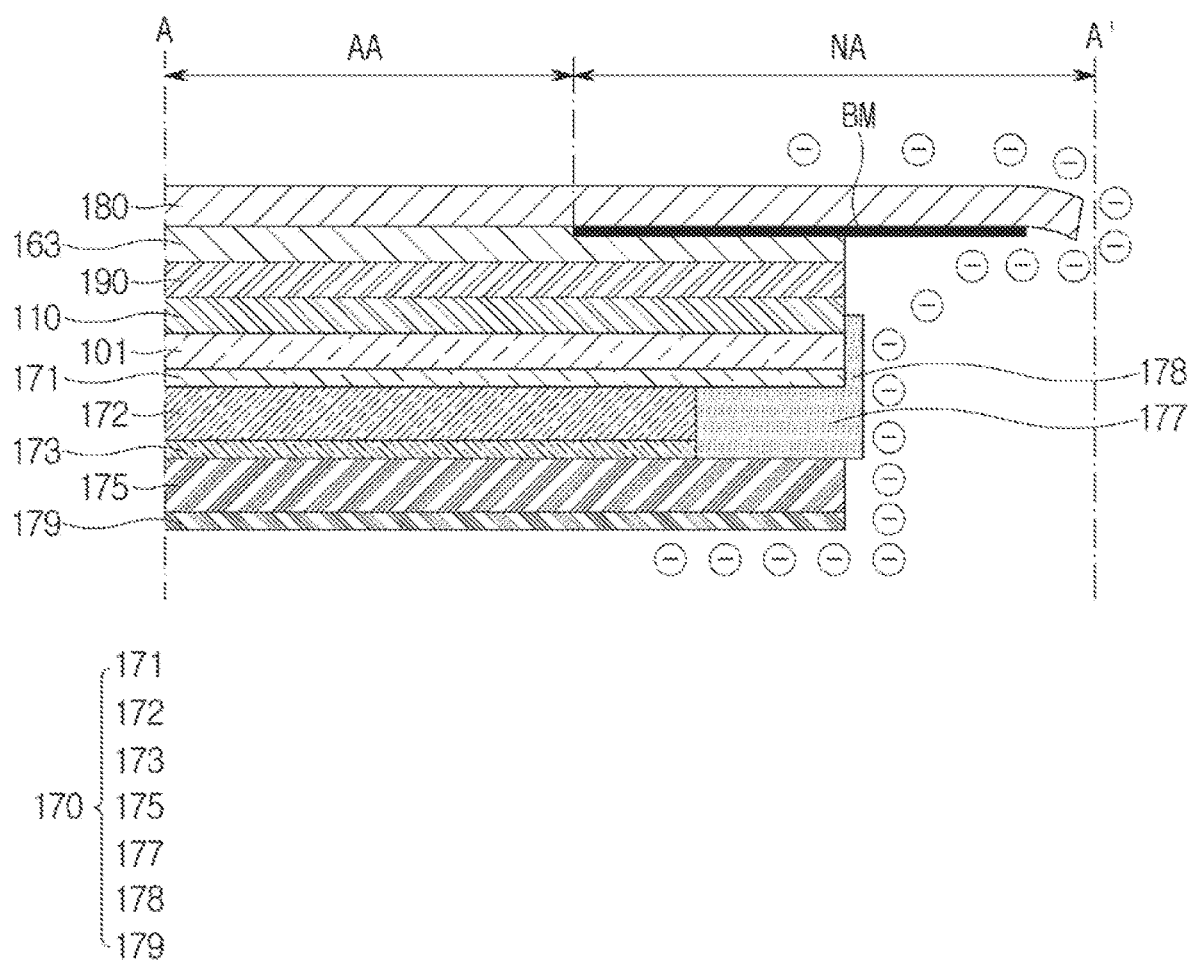

DISPLAY PANEL COMPRISING CONDUCTIVE TAPE

CROSS-REFERENCE TO RELATED APPLICATION

The present application claims priority to Korean Patent Application No. 10-2021-0192362, filed in the Republic of Korea on Dec. 30, 2021, the entire contents of which are expressly incorporated by reference into the present application.

BACKGROUND OF THE DISCLOSURE

Field of Technology

The present disclosure relates to a display panel and particularly to a display panel capable of preventing a Greenish phenomenon by preventing electric charge generated upon the cover window from penetrating into the inside of a display panel, by means of disposing a conductive tape below a panel layer so as to induce electric charge generated upon the cover window through gravitation.

Description of the Related Art

As examples of a display device, a Liquid Crystal Display (LCD), a Field Emission Display Device (FED), an Electrowetting Display Device (EWD) and an Organic Light Emitting Display Device (OLED) are used.

Such a display device can include a cover window made of a glass or plastic material so as to protect a display panel from external shocks. However, there can be a limitation in that electric charge generated by friction between the cover window and an external object or generated from the outside can pile up in the cover window. In addition, such electric charge can transfer from a side of the display panel to a panel layer inside the display panel, and that may cause a shift in threshold voltage which shifts a threshold voltage of a driving thin film transistor mounted inside a display layer.

If the threshold voltage of the driving thin film transistor is shifted higher by the shift phenomenon, the display panel can emit light by a voltage higher than before, and a Greenish phenomenon where an end or a side area of the display panel emits light brighter than the light emitted in other areas can occur, which can cause a deteriorated image quality. In the alternative, if the threshold voltage of the driving thin film transistor is decreased by the shift phenomenon, the display panel can emit light by a signal lower than an emission signal, and such can cause a Greenish phenomenon to occur, which can emit a brighter light in certain area compared to other areas, leading to a possible deteriorated image quality.

SUMMARY OF THE DISCLOSURE

One purpose of the present disclosure is to resolve limitations associated with the Greenish phenomenon by preventing electric charge generated by friction on the surface of the cover window from penetrating into the inside of the display panel.

One embodiment of the present disclosure provides a display panel including a cover window, a panel layer disposed below the cover window, and a support member disposed below the panel layer. The support member can include a first adhesive layer, a first cushion layer disposed below the first adhesive layer, and a conductive tape disposed below the first cushion layer, covered by the first cushion layer and including a conductive material. The support member further includes a heat dissipation sheet disposed below the conductive tape and electrically connected with the conductive tape.

The first cushion layer can include a light blocking material.

The conductive tape can be electrically connected with the heat dissipation sheet by directly contacting with the heat dissipation sheet.

The display panel can further include a second adhesive layer disposed below the first cushion layer, and a second cushion layer disposed below the second adhesive layer.

The conductive tape can further include a vertical portion protruding outwards and formed vertically along a side of the first cushion layer.

The display panel can further include a third adhesive layer disposed below the first cushion layer, covering a bottom portion of the conductive tape and directly contacting with the heat dissipation sheet.

The third adhesive layer can include a conductive material and the conductive tape can be electrically connected with the heat dissipation sheet through the third adhesive layer.

The conductive tape can further include a vertical portion protruding outwards and formed vertically along a side of the first cushion layer.

The display panel can further include an adhesive member disposed between the cover window and the panel layer.

The display panel can further include a polarizer disposed between the adhesive member and the panel layer.

The display panel can further include a back plate disposed between the panel layer and the first adhesive layer.

The display panel can further include a black matrix formed below the cover window and overlapping the conductive tape.

Another embodiment is a display panel including a cover window, a panel layer disposed below the cover window, and a support member disposed below the panel layer. The support member can include a first adhesive layer, a first cushion layer disposed below the first adhesive layer, a conductive tape disposed below the first adhesive layer and including a conductive material, a second adhesive layer disposed below the first cushion layer, a second cushion layer disposed below the second adhesive layer and the conductive tape and covering a bottom portion of the conductive tape, and a heat dissipation sheet disposed below the second cushion layer.

The second cushion layer can include a light blocking material.

The second cushion layer can include a conductive material, and the conductive tape can be electrically connected with the heat dissipation sheet through the second cushion layer.

The conductive tape can further include a vertical portion protruding outwards and formed vertically along a side of the panel layer.

The display panel can further include an adhesive member disposed between the cover window and the panel layer, a polarizer disposed between the adhesive member and the panel layer, and a back plate disposed between the panel layer and the first adhesive layer.

The display panel may further include a black matrix formed below the cover window and overlapping the conductive tape.

A display device including the display panel as described above.

According to the present disclosure, electric charge generated in the cover window may not be penetrated into the panel layer.

According to the present disclosure, a shift phenomenon in a transistor inside a panel layer can be prevented.

According to the present disclosure, a Greenish phenomenon that occurs in a panel layer can be prevented.

According to the present disclosure, electric charge generated in the cover window can be discharged to a heat dissipation sheet through a conductive tape.

According to the present disclosure, reflection feeling of the conductive tape can be reduced.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

FIG. 14 is a modification of the embodiment of FIG. 13 and shows a section in A-A' direction of the display panel in FIG. 8.

DETAILED DESCRIPTION OF THE EMBODIMENTS

Figure 1:
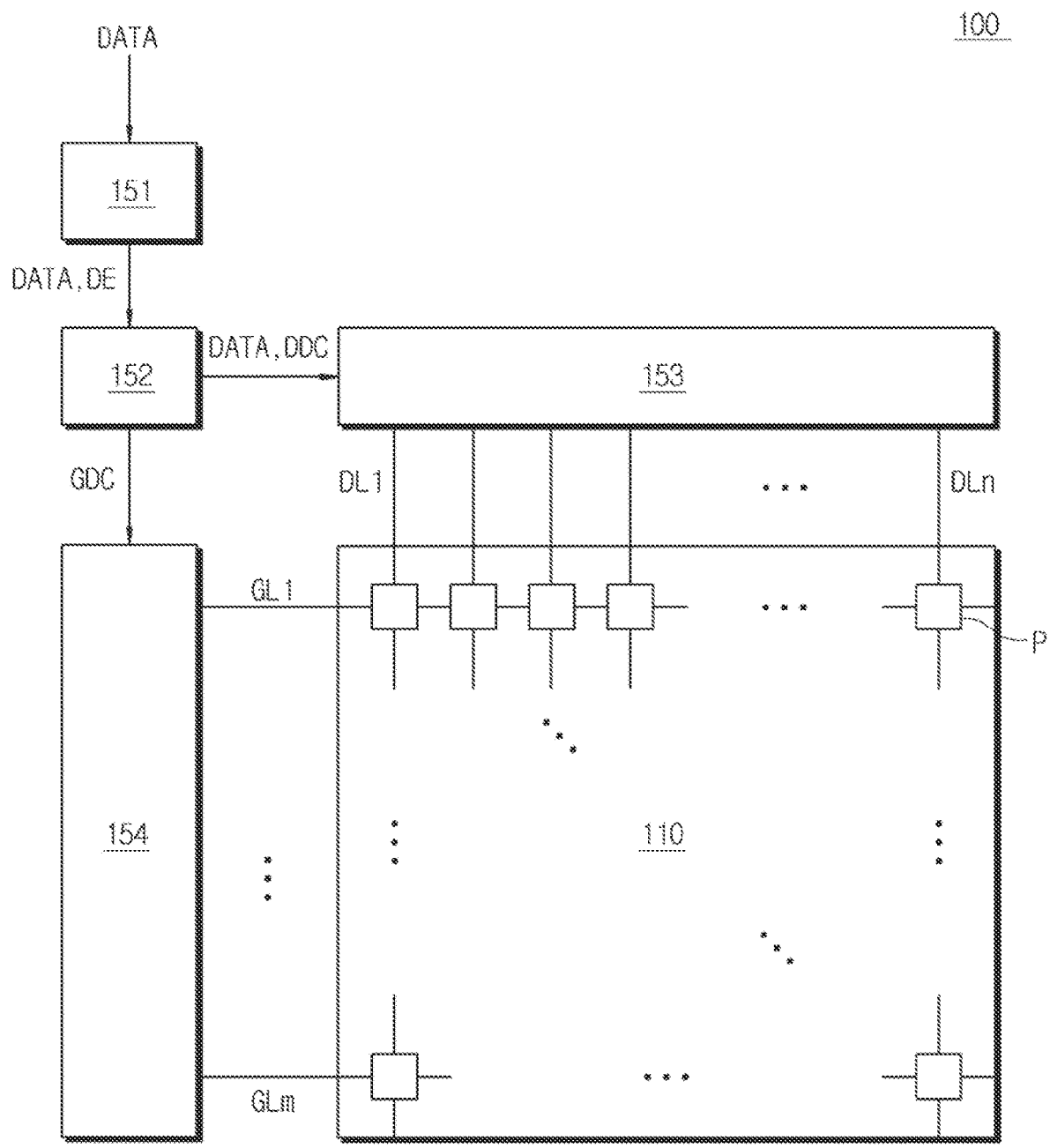
FIG. 1 is a block diagram of a display panel according to an embodiment of the present disclosure.

Hereinafter, the embodiments will be described with reference to the accompanying drawings. When an element (or an area, a layer, a part and the like) is 'on' another element, is 'connected' with, or is 'coupled' with another element, the element can be directly connected with or coupled to another element or a third intervening element can be disposed therebetween.

Like reference numerals of the accompanying drawings denote like elements. In addition, thicknesses, ratios and dimensions of the elements in the accompanying drawings are exaggerated for convenience of describing the specification. The term "and/or" includes any and all combinations of one or more of the associated listed items.

Though terms such as 'a first', or 'a second' are used to describe various components, these components are not confined by these terms. These terms are merely used to distinguish one component from the other component, and may not define order. For example, without departing from the scope of the rights of various embodiments of the present invention, a first component can be referred to as a second component, and similarly, a second component can be referred to as a first component. The singular forms expressed herein are intended to include the plural forms as well, unless the context expressly indicates otherwise.

Terms such as 'below', 'at a lower portion', 'on', 'at an upper portion' and the like are used to describe position relation of parts illustrated in the accompanying drawings. Such terms are of relative concept, and are explained based on the directions marked in the drawings.

It should be understood that terms such as 'comprise', or 'have' and the like are used only to designate that there are features, numbers, steps, operations, components, parts or combination thereof, however such terms do not preclude existence or addition of one or more another features, numbers, steps, operations, components, parts or combination thereof.

Further, the present disclosure decided to explain an organic light emitting display device as an example for convenience of description. However, the concept of the present disclosure is not confined by the organic light emitting display device, and can be applied in the same way to other types of display panels such as a liquid crystal display panel, a mini-LED display panel and the like. All the components of each display device according to all embodiments of the present disclosure are operatively coupled and configured.

FIG. 1 is a block diagram of a display panel according to an embodiment of the present disclosure.

Referring to FIG. 1, a display panel 100 can include an image processor 151, a timing controller 152, a data driver 153, a gate driver 154 and a panel layer 110.

The image processor 151 can output a data enable signal (DE) and a data signal (DATA) being supplied from the outside. Apart from the data enable signal (DE), the image processor 151 can output one or more signals among a vertical synchronizing signal, a horizontal synchronization signal and a clock signal.

The timing controller 152 is supplied with the data signal (DATA), and a driving signal that includes the data enable signal (DE), a vertical synchronizing signal, a horizontal synchronizing signal and a clock signal from the image processor 151. The timing controller 152 can output a gate timing control signal (GDC) for controlling an operation timing of a gate driver 154, and a data timing control signal (DDC) for controlling an operation timing of a data driver 153.

In response to the data timing control signal (DDC) supplied from the timing controller 152, the data driver 153 can convert the data signal (DATA) into gamma reference voltages through sampling and latching and output it thereafter. The data driver 153 can output the data signal (DATA) through data lines (DL1~DLn).

The gate driver 154 can output a gate signal while shifting a level of a gate voltage in response to the gate timing control signal (GDC) supplied by the timing controller 152. The gate driver 154 can output the gate signal through gate lines (GL1~GLm).

The panel layer 110 can display an image as sub-pixels (P) emit light by responding to the data signal (DATA) and the gate signal supplied by the data driver 153 and the gate driver 154. Detailed structure of a sub-pixel (P) will be described with reference to FIGS. 2 to 5. A group of the sub-pixels P can correspond to a pixel so that pixels are provided in the panel layer 110.

Figure 2:
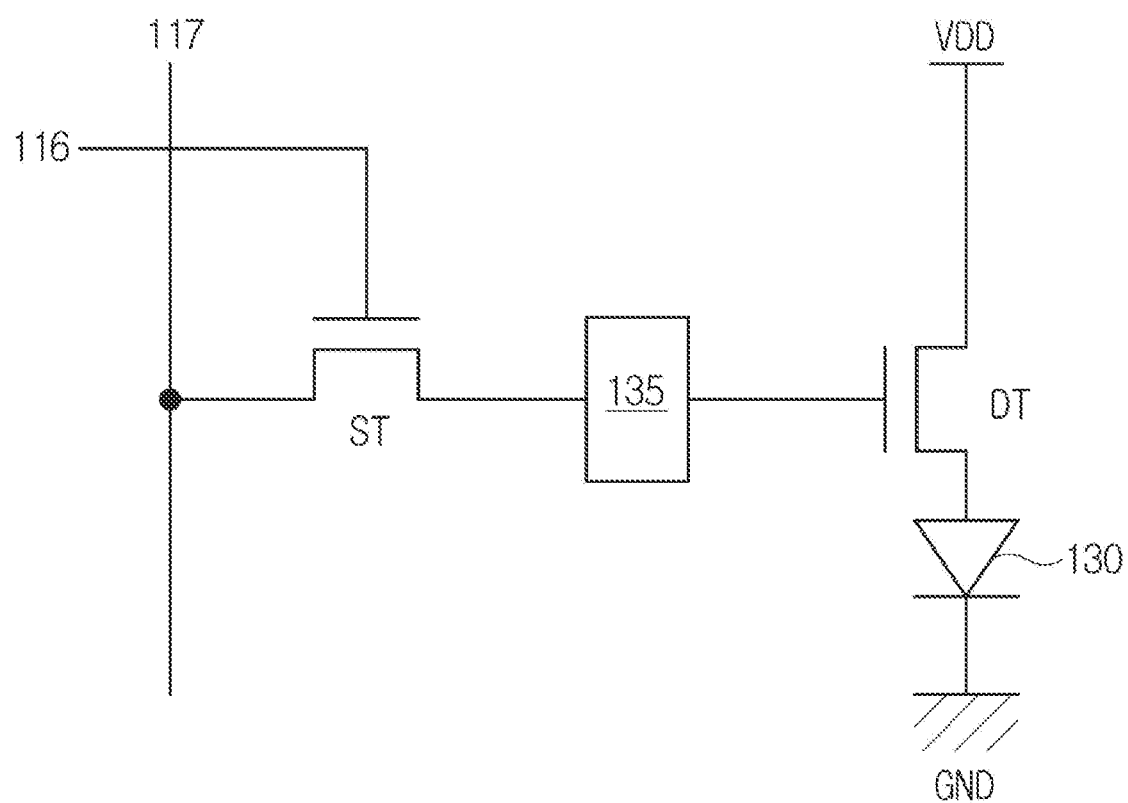
FIG. 2 is a circuit diagram of a sub-pixel included in the display panel according to the embodiment of the present disclosure.

FIG. 2 is a circuit diagram of a sub-pixel included in the display panel according to the embodiment of the present disclosure. Each sub-pixel P in the display panel of FIG. 1 can have the configuration of the sub-pixel in FIG. 2.

Referring to FIG. 2, a sub-pixel of the display panel 100 can include a switching transistor (ST), a driving transistor (DT), a compensation circuit 135 and a light emitting element 130.

The light emitting element 130 can operate to emit light by a driving current formed by a driving transistor (DT).

The switching transistor (ST) can operate switching so that the data signal supplied through a data line 117 responding to the gate signal provided through a gate line 116 can be saved as a data voltage in a capacitor.

The driving transistor (DT) can operate to flow a regular driving current between a high potential power line (VDD) and a low potential power line (GND), by corresponding to a data voltage stored in a capacitor.

The compensation circuit 135 compensates a threshold voltage of the driving transistor (DT) and the like, and the compensation circuit 135 can include one or more thin film transistors and capacitors.

Configuration of the compensation circuit 135 can vary greatly depending on manners of compensation. For example, a sub-pixel in FIG. 2 is configured as 2T1C (two Transistors and one Capacitor) structure which includes a switching transistor (ST), a driving transistor (DT), a capacitor and a light emitting element 130. However, if a compensation circuit 135 is added thereto, the sub-pixel can be configured variously such as 3T1C, 4T2C, 5T2C, 6T1C, 6T2C, 7T1C, 7T2C and the like.

Figure 3:
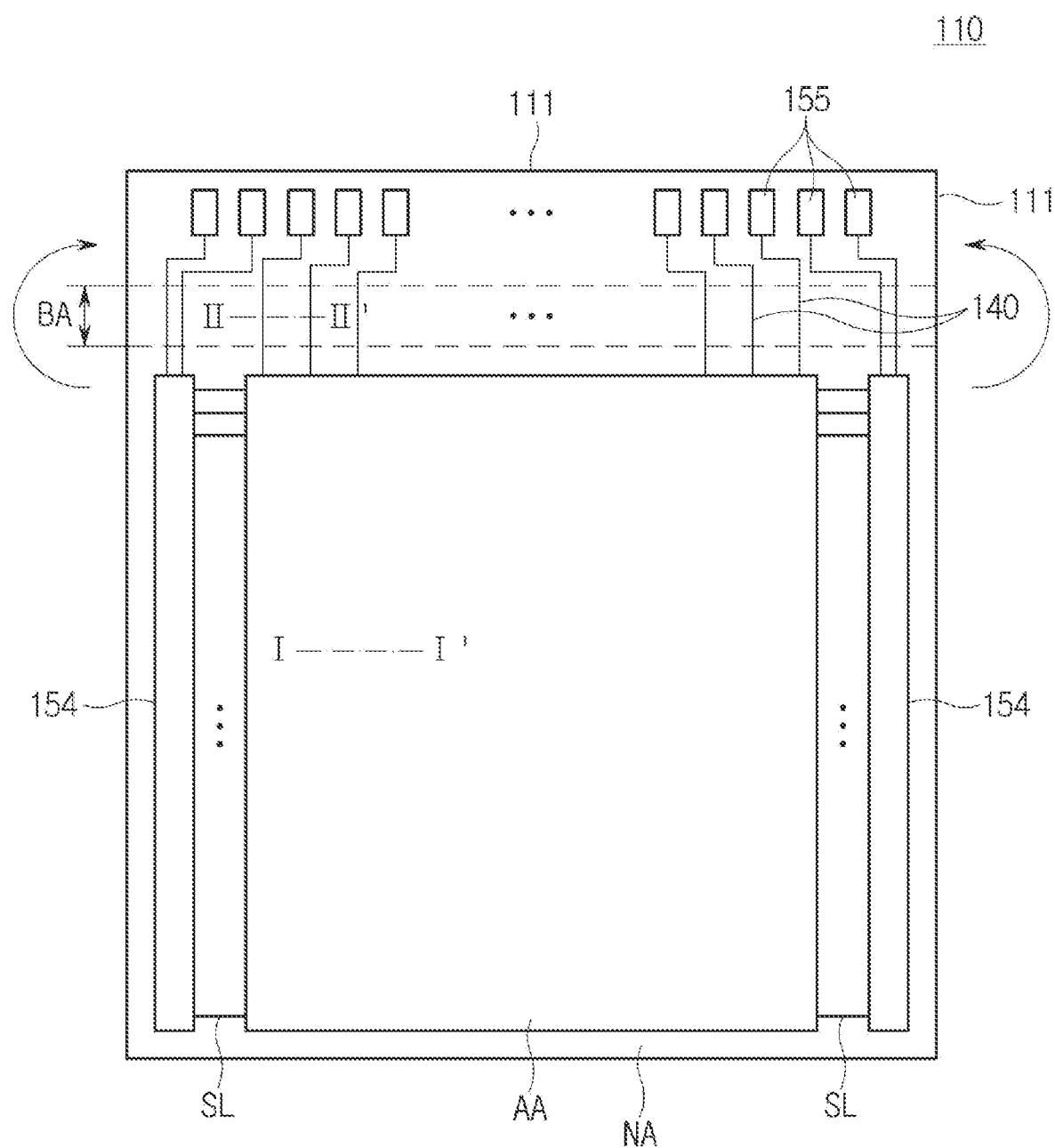
FIG. 3 is a plan view of a display panel according to the embodiment of the present disclosure.

FIG. 3 is a plan view of a display panel according to an embodiment of the present disclosure. FIG. 3 shows an example of a state where a panel layer of the display panel 100 is not bent.

Referring to FIG. 3, the panel layer 110 can include an active area (AA) where pixels emitting light through a thin film transistor and a light emitting element are disposed upon a flexible substrate 111, and a non-active area (NA) that is the bezel area surrounding edges of the active area (AA).

In the non-active area (NA) of the flexible substrate 111, a circuit such as a gate driver 154 to drive the panel layer 110 and the like and wirings of various signals such as a scan line (SL) and the like can be disposed.

A circuit to drive the panel layer 110 can be disposed upon the flexible substrate 111 in Gate in Panel (GIP) manner, or be connected to the flexible substrate 111 in Tape Carrier Package (TCP) or Chip on Film (COF) manner.

A bending area (BA) can be formed on a side of the non-active area (NA). The bending area (BA) can refer to an area of the flexible substrate 111 that is configured to be bent in an arrow direction.

In the non-active area (NA) of the flexible substrate 111, wirings and a driving circuit in order to drive a screen are disposed. Since an image is not displayed in the non-active area (NA), the non-active area (NA) does not need to be acknowledged from a front surface of the flexible substrate 111. Therefore, an area to position the wirings and the driving circuit can be secured while at the same time reducing the bezel, by bending some area of the non-active area (NA) of the flexible substrate 111.

Various wirings can be formed upon the flexible substrate 111. The wiring can be formed in the active area (AA) or in the non-active area (NA) of the flexible substrate 111. The wiring of circuits 140 is formed of a conductive material, and can be formed of a conductive material with excellent flexibility in order to reduce a crack that is likely to occur when the flexible substrate 111 is bent. The wiring of circuits 140 can be formed of a conductive material with excellent flexibility. The wiring of circuits 140 can be formed of conductive materials having excellent flexibility such as gold (Au), silver (Ag), aluminum (Al) and the like. Or, the wiring of circuits 140 can be formed of alloys of magnesium (Mg) and silver (Ag), molybdenum (Mo), chrome (Cr), titanium (Ti), nickel (Ni), neodymium (Nd) and copper (Cu). The wiring of circuits 140 can be formed in a multi-layer structure that includes various conductive materials, and for example, can be formed in a three-layer structure consisting of titanium (Ti), aluminum (Al) and titanium (Ti).

The wiring of circuits 140 formed in the bending area (BA) gets tensile force when being bent. The wiring of circuits 140 that extends in the same direction as a bending direction in the flexible substrate 111 gets the biggest tensile force. Therefore, some of the wiring of circuits 140 disposed in the bending area (BA) can be formed to extend in a diagonal direction which differs from the bending direction.

Figure 4:
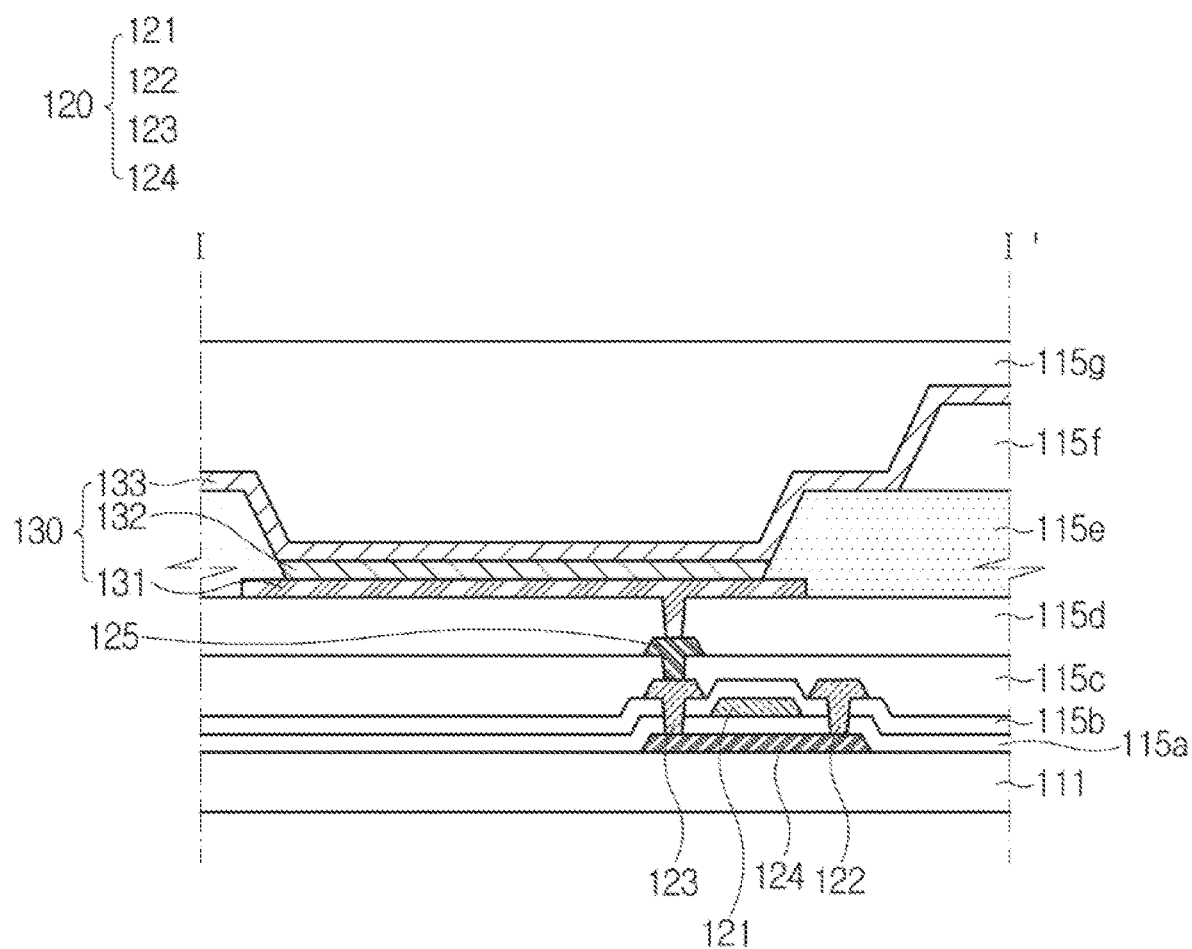
FIG. 4 is a sectional view of a panel layer taken along I-I' of FIG. 3.

FIG. 4 is a sectional view of a panel layer taken along I-I' of FIG. 3.

Figure 5:
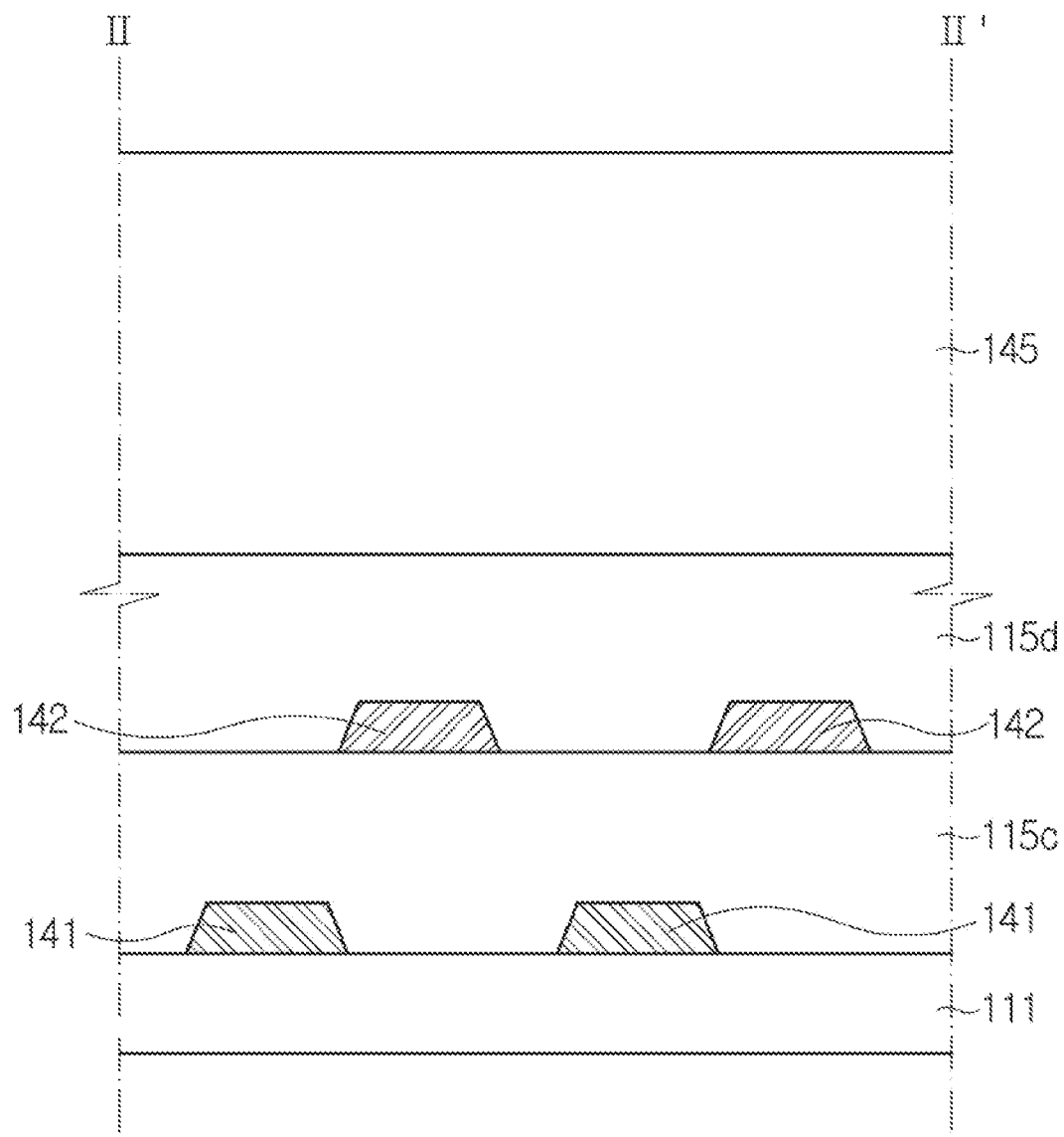
FIG. 5 is a sectional view of a panel layer taken along II-II' of FIG. 3.

FIG. 5 is a sectional view of a panel layer taken along II-IF of FIG. 3.

The panel layer 110 according to the present disclosure will be described by referring to FIG. 4 and FIG. 5.

Referring to FIG. 4, the flexible substrate 111 is a plate-shaped configuration disposed at the bottom, and serves to support and protect other components disposed upon the flexible substrate 111. The flexible substrate 111 can be formed of glass or plastic. For example, the flexible substrate 111 can be formed of a film including one of the groups consisting of a polyester polymer, a silicone polymer, an acrylic polymer, a polyolefin polymer, and a copolymer thereof.

A buffer layer can be further disposed in the flexible substrate 111. The buffer layer prevents penetration of moisture or foreign substance from the outside into the flexible substrate 111, and can flatten a surface of the flexible substrate 111. The buffer layer is not a necessary configuration, and can be omitted depending on a kind/type of a thin film transistor 120 disposed in the flexible substrate 111.

The thin film transistor 120 is disposed in the flexible substrate 111 and can include a gate electrode 121, a source electrode 122, a drain electrode 123 and a semiconductor layer 124. The semiconductor layer 124 can be formed of amorphous silicon or polycrystalline silicon. The semiconductor layer 124 can be formed of an oxide semiconductor. The semiconductor layer 124 can include a drain region, a source region including p-type or n-type impurities and a channel region existing between the source region and the drain region. In addition, the semiconductor layer 124 can further include a lightly-doped region in the source region or the drain region located adjacent to the channel region.

The source region or the drain region are heavily doped with impurities and the source electrode 122 and the drain electrode 123 of the thin film transistor 120 can be connected thereto respectively.

Depending on a structure of the thin film transistor of NMOS or PMOS, the channel region of the semiconductor layer 124 can be doped with n-type or p-type impurities.

A first insulation layer 115a can be formed of a single layer or multi-layer structure of silicon oxide (SiOx) or silicon nitride (SiNx). The first insulation layer 115a can be disposed so that a current flowing through the semiconductor layer 124 does not flow to the gate electrode 121.

The gate electrode 121 can serve as a switch for turning on or off the thin film transistor 120 based on an electric signal transmitted from the outside through the gate line. The source electrode 122 and the drain electrode 123 are connected to the data line, and can allow an electric signal transmitted from the outside to be transmitted from the thin film transistor 120 to the light emitting element 130.

A second insulation layer 115b can be formed on the first insulation layer 115a and the gate electrode 121. The second insulation layer 115b can be formed of a single layer or multiple layers of silicon oxide or silicon nitride to insulate the gate electrode 121, the source electrode 122 and the drain electrode 123 with each other.

A first planarization layer 115c and a second planarization layer 115d can be disposed on the second insulation layer 115b. The first planarization layer 115c and the second planarization layer 115d can be configurations to protect the thin film transistor 120 and flatten out steps formed by the thin film transistor 120. The first planarization layer 115c and the second planarization layer 115d can be formed of one or more materials among acrylic resin, epoxy resin, phenol resin, polyamide resin, unsaturated polyester resin, poly-phenylene resin, poly-phenylene sulfide resin, and benzocyclobutene.

An intermediate electrode 125 can be connected to the thin film transistor 120 through a contact hole formed in the first planarization layer 115c. The intermediate electrode 125 can electrically connect an anode electrode 131 and the drain electrode 123 of the thin film transistor 120.

The light emitting element 130 can be disposed on the second planarization layer 115d. The light emitting element 130 can include the anode electrode 131, a light-emitting portion 132 and a cathode electrode 133.

The anode electrode 131 is disposed on the second planarization layer 115d, and can serve to supply holes to a light-emitting portion 132. The anode electrode 131 can contact with the intermediate electrode 125 through a contact hole formed to penetrate the second planarization layer 115d. The anode electrode 131 can be formed of indium zinc oxide, indium tin oxide and the like which are transparent conductive materials.

A bank 115e can be disposed on the anode electrode 131 and the second planarization layer 115d. The bank 115e can define sub-pixels by dividing areas that actually emit light. A spacer 115f can be disposed on the bank 115e so as to prevent damage arising upon contacting with a deposition mask.

The light-emitting portion 132 can be disposed on the anode electrode 131. The light-emitting portion 132 can serve to emit light. The light-emitting portion 132 can include organic light emitting materials that emit light by themselves by an electric signal. The light-emitting portion 132 can include organic light emitting materials that emit colors, for example, red, green, blue, white and the like.

The cathode electrode 133 can be disposed on the light-emitting portion 132. The cathode electrode 133 can serve to supply an electron to the light-emitting portion 132. The cathode electrode 133 can be formed of a metal material such as magnesium (Mg), an alloy of silver and magnesium and the like. In addition, the cathode electrode 133 can be formed of transparent conductive oxides such as series of tin oxide, indium zinc oxide, indium tin oxide, indium zinc tin oxide, zinc oxide and the like.

An encapsulation layer 115g can be disposed on the cathode electrode 133. The encapsulation layer 115g can serve to prevent damage arising out of oxidization of components disposed below after moisture, oxygen, or foreign material introduced from the outside penetrate into the components. The encapsulation layer 115g can be formed by laminating a plurality of barrier films. The encapsulation layer 115g can be formed of aluminum oxide or silicon nitride which are inorganic substances.

In describing FIG. 5, descriptions that are redundant with what are mentioned above will be omitted or may be briefly described.

Referring to FIG. 5, the display panel 100 according to the present disclosure can include a first wiring 141 and a second wiring 142 configured in a double-layer in the non-active area (NA) that includes the bending area (BA).

Specifically, on the flexible substrate 111, the first wiring 141 can be formed. On the first wiring 141, the first planarization layer 115c can be formed. On the first planarization layer 115c, the second wiring 142 can be formed. On the second wiring 142, the second planarization layer 115d can be formed. On the second planarization layer 115d, a micro-coating layer 145 can be formed.

The first wiring 141 and the second wiring 142 are aimed at connecting the panel layer 110 and the pad area (PA). The first wiring 141 and the second wiring 142 can be formed of conductive materials having excellent flexibility such as silver, gold, aluminum and the like. Or, the first wiring 141 and the second wiring 142 can be formed of alloys of molybdenum, chrome, titanium, nickel, neodymium, copper, silver and the like.

While the flexible substrate 111 is being bent, a huge stress is given to the bending area (BA). A crack can occur in layers that wrap wirings due to such stress. Further, a large space to arrange wirings is required when forming wirings in a single layer. As in the present disclosure, by configuring wirings passing the bending area (BA) to be formed in a multiple-layer structure, it is possible to reduce stress occurring in layers wrapping the wirings and decrease a space to arrange the wirings.

Figure 6:
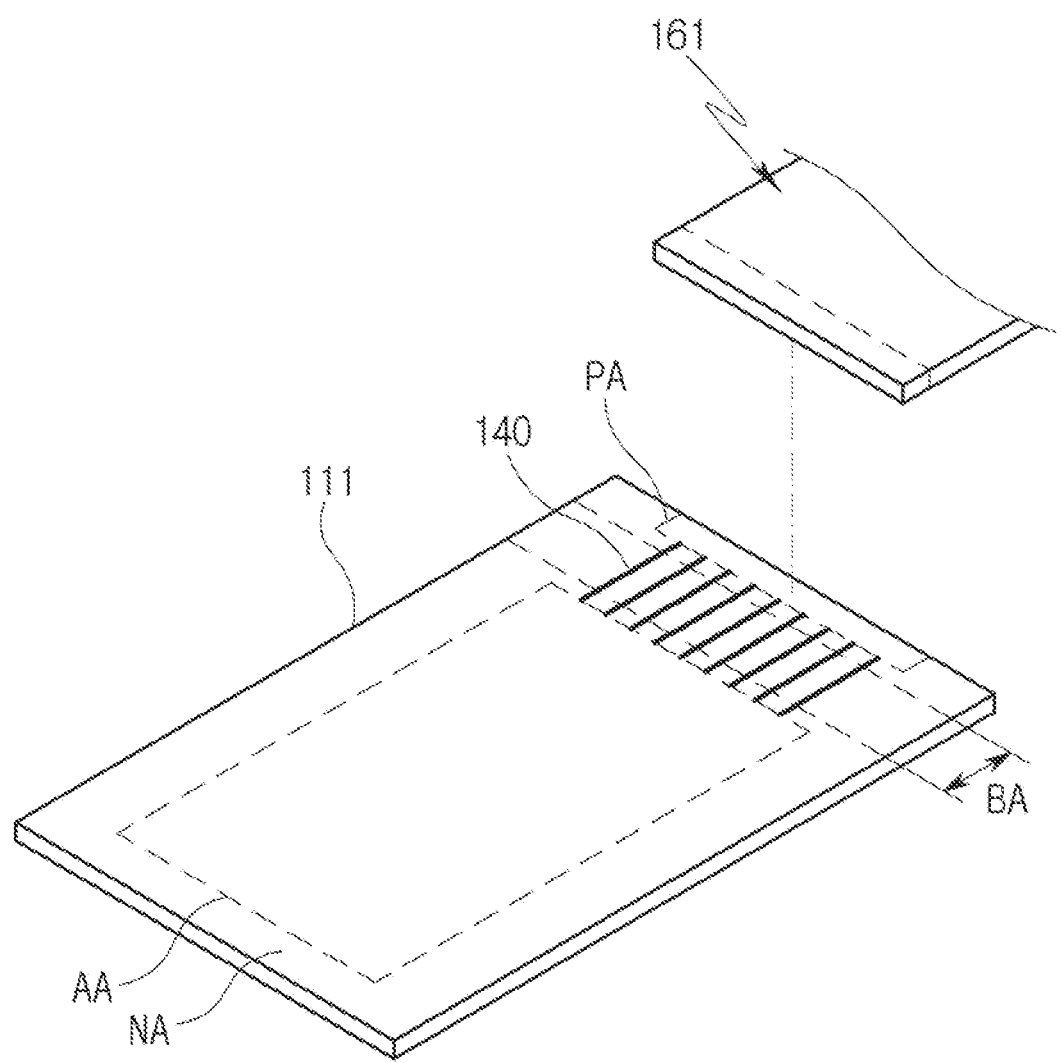
FIG. 6 is a perspective view of a flexible panel according to the embodiment of the present disclosure.

FIG. 6 is a perspective view of a flexible panel according to the embodiment of the present disclosure.

Figure 7:
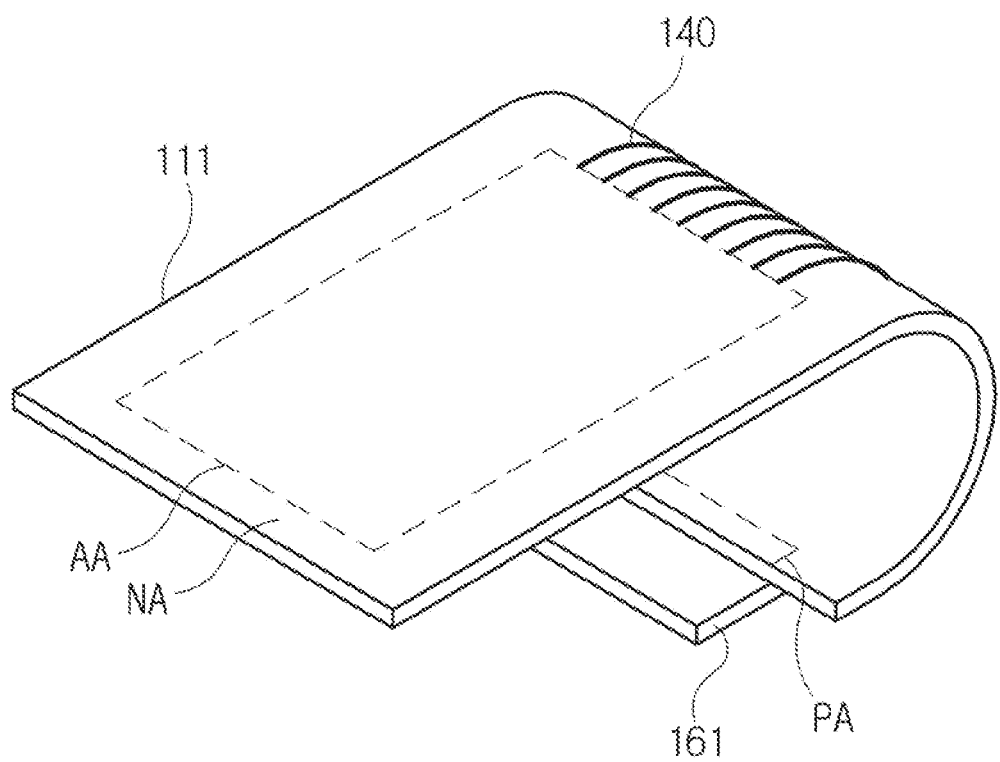
FIG. 7 is a perspective view that shows a bending status of a flexible panel according to the embodiment of the present disclosure.

FIG. 7 is a perspective view that shows a bending status of a flexible panel according to the embodiment of the present disclosure.

Figure 8:
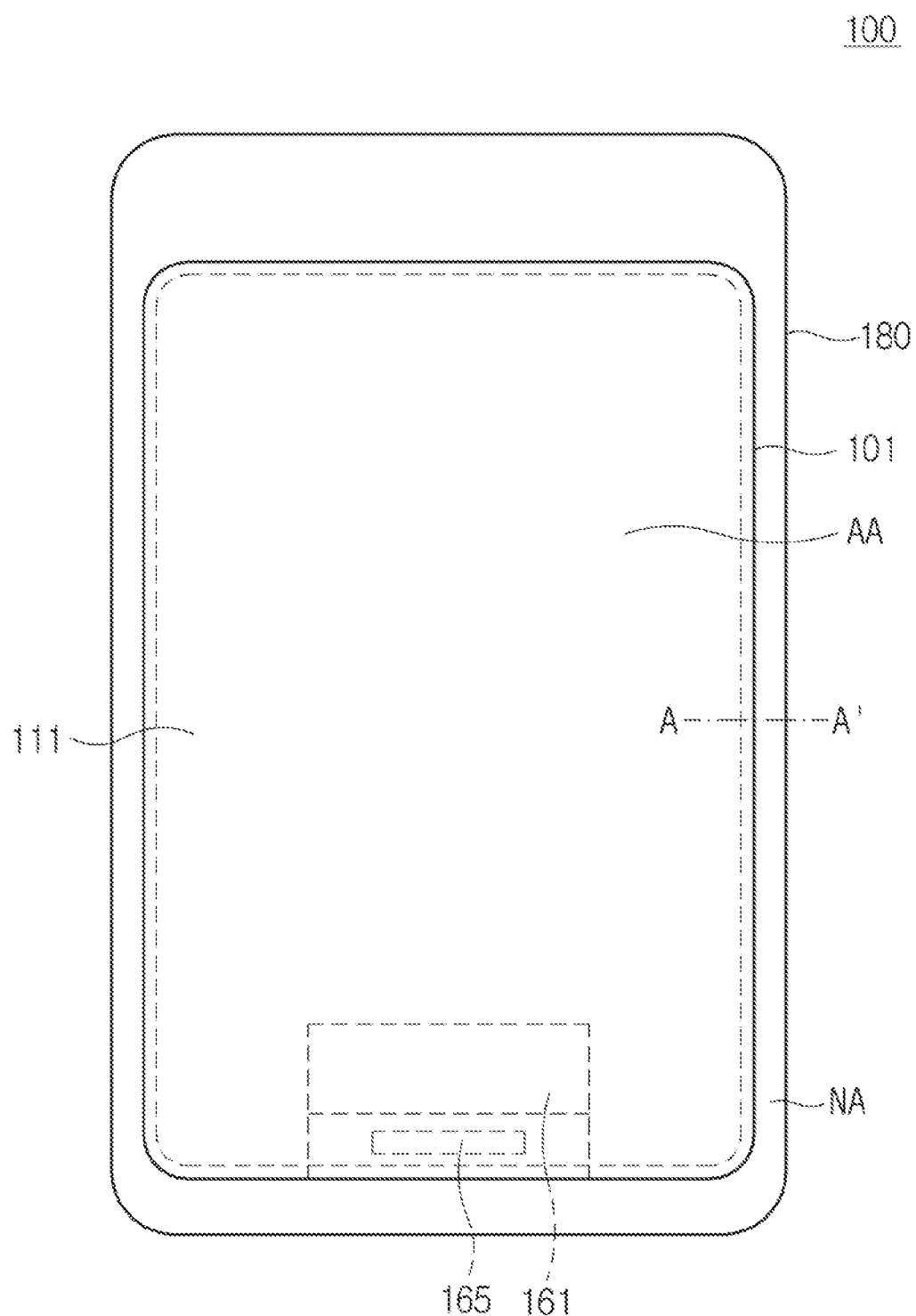
FIG. 8 is a plan view that shows a bent flexible panel according to the embodiment of the present disclosure.

FIG. 8 is a plan view that shows a bent flexible panel according to the embodiment of the present disclosure.

Referring to FIGS. 6 to 8, the flexible substrate according to one or more embodiments of the present disclosure will be explained.

Referring to FIG. 6, the flexible substrate 111 can be divided into the active area (AA) and the non-active area (NA) surrounding edges of the active area (AA). In the non-active area (NA), the pad area (PA) in which the pads are disposed can be divided. In the active area (AA), a plurality of sub-pixels are disposed. The sub-pixels can be divided by gate lines and data lines that cross each other.

A circuit element 161 can be a configuration that is connected with the pads in the pad area (PA) of the flexible substrate 111. The circuit element 161 can include bumps or steps. The bumps of the circuit element 161 can be connected with the pads of the pad area (PA) through an anisotropic conductive film. The circuit element 161 can be a Chip on Film (COF) in which a driver IC (integrated circuit) is mounted in a flexible film. In addition, the circuit element 161 can be bonded to the pads directly through Chip on Glass (COG) process. Further, the circuit element 161 can be a flexible circuit such as a Flexible Printed Circuit (FPC). The present disclosure will be described based on COF taken as an example of the circuit element 161.

Referring to FIG. 7, the flexible substrate 111 can be bent in a rear direction so that a side contacting with the pad area (PA) can have a predefined curvature. As the flexible substrate 111 gets bent, the pad area (PA) can overlap with the active area (AA) in a rear direction of the active area (AA). From the front of the display panel 100, the circuit element 161 or the driver IC 165 may not be made visible. For bending, the flexible substrate 111 can be formed of a flexible material. For example, the flexible substrate 111 can be formed of a plastic material such as polyimide.

Referring to FIG. 8, on a surface of the bent flexible substrate 111, the cover window 180 can be coupled. The cover window 180 is formed to be larger than the bent flexible substrate 111 so that the cover window 180 can accommodate the flexible substrate 111 in its inside.

Further, on another surface of the bent flexible substrate 111, a backplate 101 can be coupled. The backplate 101 can serve to maintain rigidity of the display panel 100, prevent foreign substances from attaching to the bottom portion of the display panel 100 and absorb external shocks. The backplate 101 can be implemented as a plastic thin film made of polyimide. Forming the backplate 101 not in the bending area (BA) can be appropriate.

Figure 9:
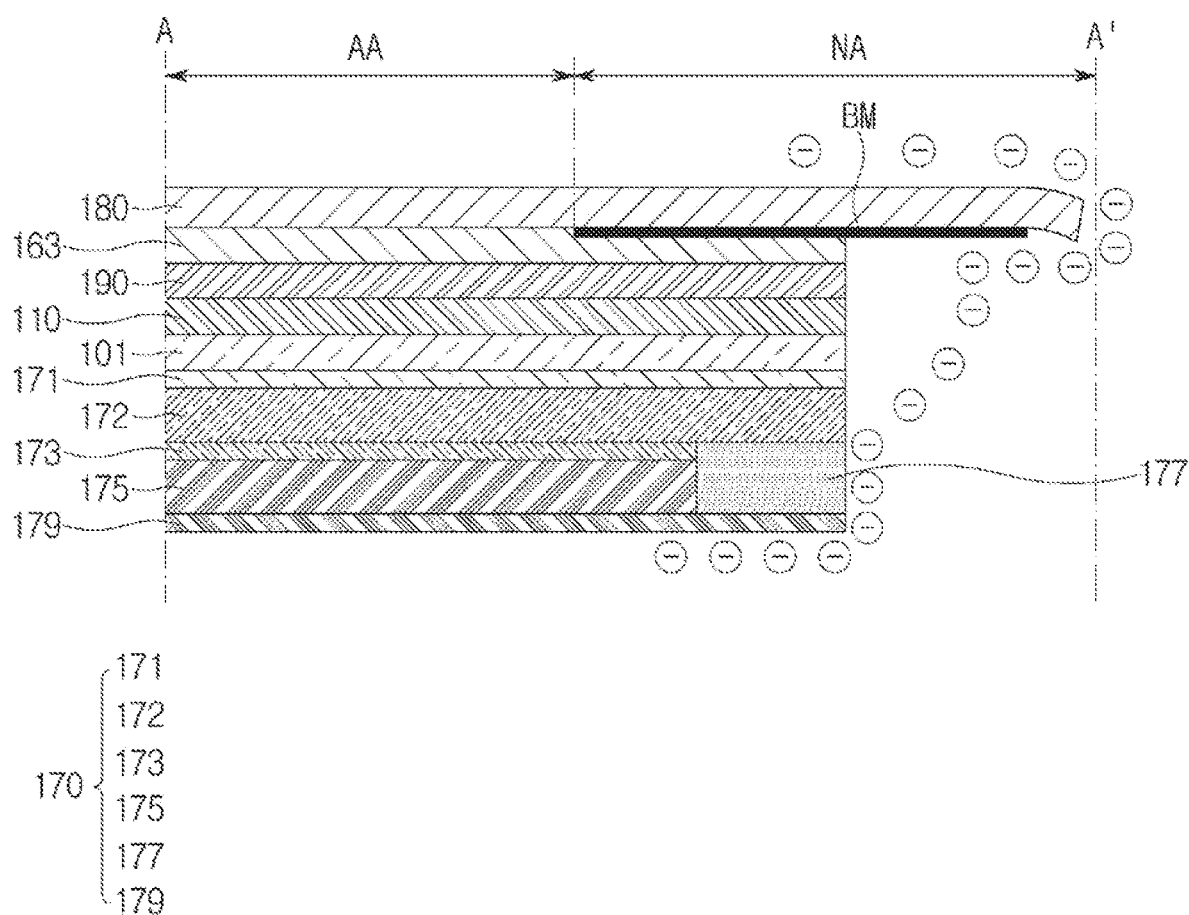
FIG. 9 shows a section taken in A-A' direction of the display panel of FIG. 8 according to the embodiment of the present disclosure.

FIG. 9 shows a section taken in A-A' direction of the display panel of FIG. 8 according to the embodiment of the present disclosure.

The display panel 100 according to the embodiment of the present disclosure will be explained below by referring to FIG. 9.

The display panel 100 can include the cover window 180 disposed at the uppermost layer, the adhesive member 163 disposed below the cover window 180, the polarizer 190 disposed below the adhesive member 163 and the panel layer 110 disposed below the polarizer 190. As described by referring to FIG. 4, the panel layer 110 can include the flexible substrate and can be bent in the bending area. FIG. 9 is a sectional view taken along A-A' of FIG. 8, and is not an area where the flexible substrate or the panel layer 110 is bent.

The cover window 180 is disposed on an uppermost surface of the display panel 100 and can be formed of glass or plastic. The cover window 180 serves as a protection layer protecting internal elements of the display panel 100 and are exposed outside. Therefore, the cover window 180 is contacted with a finger of a user when a user of the display device touches it and then electric charge can occur due to friction. The electric charge occurred by friction and the like can transfer along a side of the cover window 180 and penetrate into the inside of the display panel 100.

The adhesive member 163 is disposed below the cover window 180 and serves to adhere the cover window 180 to the polarizer 190. The adhesive member 163, for example, can be an Optical Clear Adhesive (OCA) or a Pressure Sensitive Adhesive (PSA) and can be of a transparent material.

The polarizer 190 can be formed of a film having a feature of polarization. The polarizer 190 can suppress reflection of external light and reduce reflection feeling when the display device is viewed in the outside. The polarizer 190 can be disposed in the active area (AA).

The panel layer 110 is a layer where one or more pixels are formed and a transistor including the gate electrode, the source electrode, the drain electrode and the semiconductor layer and the like are formed in the inside. Further, the panel layer 110 can be a layer where light emitting diodes such as the anode electrode, the light emitting layer, the cathode electrode and the like are formed. If frictional charge penetrates into the inside of the panel layer 110 described above, the transistor can have the shift phenomenon and deterioration in the display quality can be caused by the Greenish phenomenon.

The back plate 101 is a firm structure formed below the panel layer 110 and can serve to reinforce rigidity of the panel layer 110. The back plate 101 can be formed of a plastic thin film.

The support member 170 can include the first adhesive layer 171, the first cushion layer 172, the second adhesive layer 173, the second cushion layer 175 and the heat dissipation sheet 179. In addition, the support member 170 can further include a conductive tape 177.

The first adhesive layer 171 can be disposed on a rear surface of the back plate 101. The first adhesive layer 171 can include an embossed pattern. The embossed pattern can improve a problem of air bubbles that can be formed therein. The first cushion layer 172 can serve to be pressed and absorb shocks when an external force is given thereto. The first cushion layer 172 can be disposed on a rear surface of the first adhesive layer 171. The second adhesive layer 173 can be disposed on a rear surface of the first cushion layer 172. The second adhesive layer 173 can serve to stick the first cushion layer 172 and the second cushion layer 175 together. The second adhesive layer 173, for example, can include a double-sided tape.

The first cushion layer 172 can fully cover the conductive tape 177 that is disposed below the first cushion layer 172. The first cushion layer 172 can include a light blocking material. The light blocking material can include an ink in black color. For example, the light blocking material can have a color capable of blocking light such as black, dark grey, grey and the like.

The conductive tape 177 can be disposed below the first cushion layer 172. The conductive tape 177 can be covered by the first cushion layer 172. The conductive tape 177 can be disposed on the same layer as a second adhesive layer 173. The conductive tape 177 can be disposed along the outer edges of the cover window 180. For example, the conductive tape 177 can be formed along the outer edges of the cover window 180 of the display panel 100 as explained with reference to FIG. 8. However, since the flexible substrate 111 is configured to be bent at a lower edge of the display panel 100, the conductive tape 177 may not be formed at a lower edge of the display panel 100.

With reference to FIG. 9 again, a height of the conductive tape 177 can be equal to a sum of a height of the second adhesive layer 173 and the second cushion layer 175. For example, after the second adhesive layer 173 and the second cushion layer 175 are formed, a portion with a pre-defined width of the second adhesive layer 173 and the second cushion layer 175 respectively can be removed, and the conductive tape 177 can be disposed in the removed portion.

The conductive tape 177 can include a conductive material. For example, the conductive tape 177 can include a metallic material. For example, the conductive tape 177 can be formed of silver (Ag) and the like. Therefore, the conductive tape 177 can have conductivity. The conductive tape 177 can directly contact with the heat dissipation sheet 179. For example, the conductive tape 177 can directly contact with the heat dissipation sheet 179 through an adhesive material such as a Pressure Sensitive Adhesive (PSA) that is applied on a rear surface. By doing so, the conductive tape 177 and the heat dissipation sheet 179 can be electrically connected with each other.

The heat dissipation sheet 179 can be disposed below the conductive tape 177 and can be electrically connected with the conductive tape 177. The heat dissipation sheet 179 can serve to dissipate heat. The heat dissipation sheet 179 can be formed of a metallic material such as copper, aluminum and the like to dissipate heat generated in a component, for example, in the driver IC 165 or the circuit element 161. In addition, the heat dissipation sheet 179 can serve as a ground that discharges a frictional charge induced by the conductive tape 177 through gravitation as to be described later on.

A black matrix (BM) can be formed in some areas below the cover window 180. The black matrix (BM) can be formed along edges of the display panel 100. The black matrix (BM) can be formed of a black ink.

According to the embodiment of the present disclosure, the conductive tape 177 having conductivity can be disposed below the first cushion layer 172, and the conductive tape 177 can directly contact with the heat dissipation sheet 179 that includes a metallic material. Accordingly, frictional charge generated in the cover window 180 can be prompted to be transferred. For example, the conductive tape 177 can be disposed adjacent to the panel layer 110. For example, a thickness of the back plate 101 can be 88 µm and a thickness of the first adhesive layer 171 can be 60 µm, and a thickness of the first cushion layer 172 can be 30 µm. Accordingly, a distance between the conductive tape 177 and the panel layer 110 can be 178 µm. Such a distance is very short and can induce frictional charge by gravitation. In other words, the conductive tape 177 has conductivity and can have gravitation that induces a negative charge. Therefore, frictional charge generated in the cover window 180 can transfer to the conductive tape 177 without penetrating into the panel layer 110. The frictional charge transferred to the conductive tape 177 can be discharged through the heat dissipation sheet 179. Therefore, according to the embodiment, the transistor inside the panel layer 110 may not experience the shift phenomenon and consequently the Greenish phenomenon can be prevented.

Further, according to the embodiment, the conductive tape 177 may not be recognized from the front of the display panel 100. The support member 170 disposed below a display panel 100 according to prior art is generally formed of a three-layer. The support member 170 according to prior art is configured as a three-layer consisting of the first adhesive layer 171, the first cushion layer 172 and the heat dissipation sheet 179. If applying the conductive tape 177 disclosed by the embodiment to the support member 170 of a three-layer according to prior art, a portion of the first cushion layer 172, which has the same a width as the conductive tape 177 should be removed. In addition, the conductive tape 177 should be disposed in the removed portion. Further, the conductive tape 177 can be prevented from being covered by the first cushion layer 172. Therefore, if applying prior art, from the front surface of display panel 100, the conductive tape 177 can be recognized and that is a problem. Such a problem can occur even if the black matrix (BM) is disposed thereupon. The embodiment of the present disclosure can configure the support member 170 as a five-layer consisting of the first adhesive layer 171, the first cushion layer 172, the second adhesive layer 173, the second cushion layer 175 and the heat dissipation sheet 179. In other words, the first cushion layer 172 disposed upon the conductive tape 177 can be formed to fully cover the conductive tape 177 according to the embodiment of the present disclosure. In addition, as described above, the first cushion layer 172 can include the light blocking material. Therefore, the limitation of the conductive tape 177 being recognized from the front of the display panel 100 can be resolved or addressed.

Figure 10:
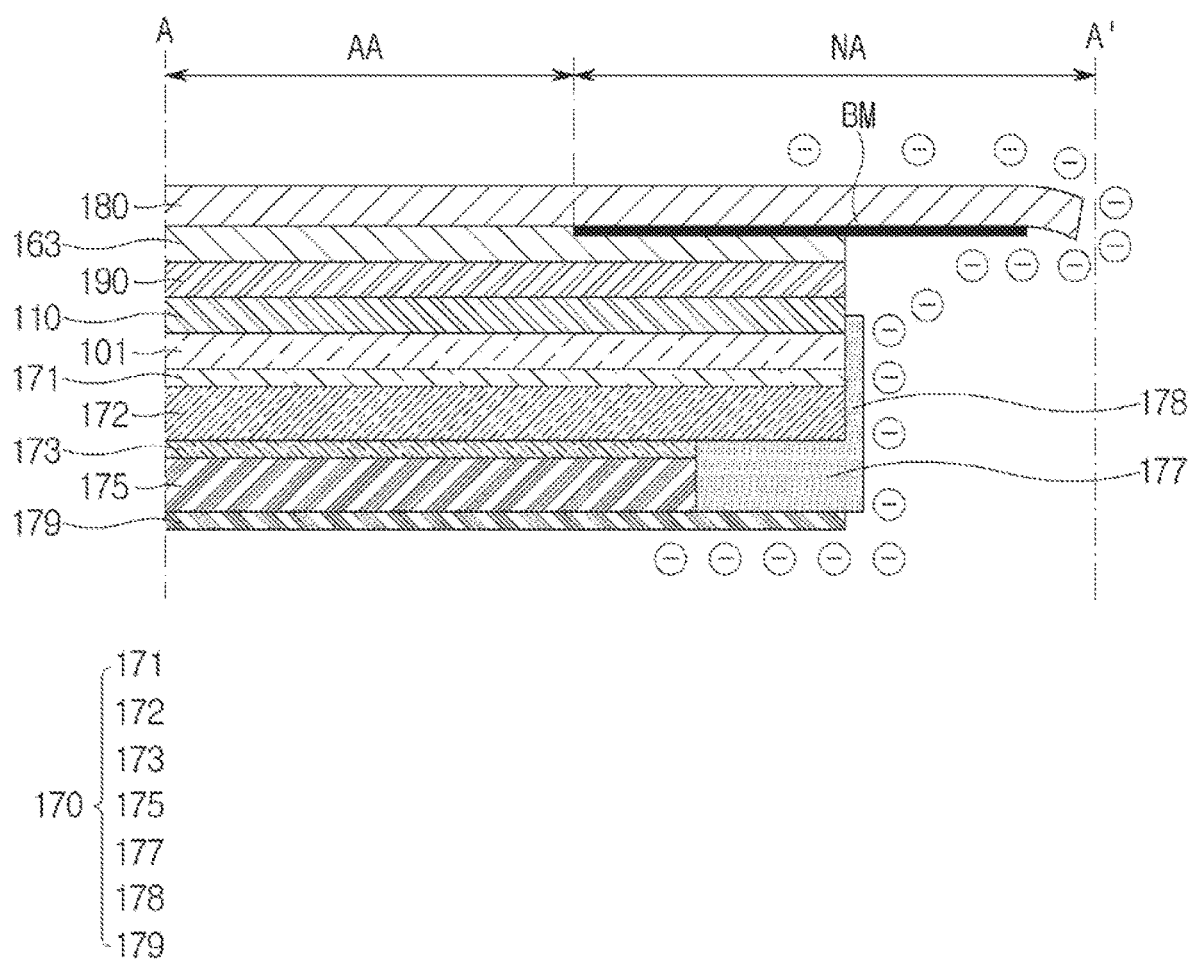
FIG. 10 is a modification of the embodiment of FIG. 9 and shows a section taken in A-A' direction of the display panel in FIG. 8.

FIG. 10 is a modification of the embodiment of FIG. 9 and shows a section taken in A-A' direction of the display panel in FIG. 8.

With reference to FIG. 10, a modification of the embodiment of FIG. 9 will be explained. Further, in describing FIG. 10, descriptions that are redundant with what are mentioned above will be omitted or may be briefly discussed.

With reference to FIG. 10, the conductive tape 177 can further include a vertical portion 178 that protrudes outwards and is formed in a vertical direction along a side of the first cushion layer 172.

Specifically, the outwards in the present disclosure refers to a direction opposite to a center of the display panel 100. Based on FIG. 10, the outwards refers to a direction from a cutting line A to a cutting line A'. From the same view point, an inwards refers to a direction from a cutting line A' to a cutting line A.

The vertical portion 178 can protrude from the conductive tape 177 and extend in a direction towards the panel layer 110. For example, the vertical portion 178 can be attached on a side of the first cushion layer 172, a side of the first adhesive layer 171 and a side of the panel layer 110.

According to the embodiment of the present disclosure, the vertical portion 178 can be formed to extend from the conductive tape 177 and can be formed of the same material as the conductive tape 177. In other words, the vertical portion 178 can include a metallic material. For example, the vertical portion 178 can be formed of silver (Ag). The vertical portion 178 can extend in a direction towards the panel layer 110. Accordingly, the vertical portion 178 can let frictional charge generated in the cover window 180 be effectively induced to the conductive tape 177. Further, if the vertical portion 178 is formed to fully cover a side of the panel layer 110, an efficiency to block frictional charge attempting to penetrate into the panel layer 110 can improve.

Figure 11:
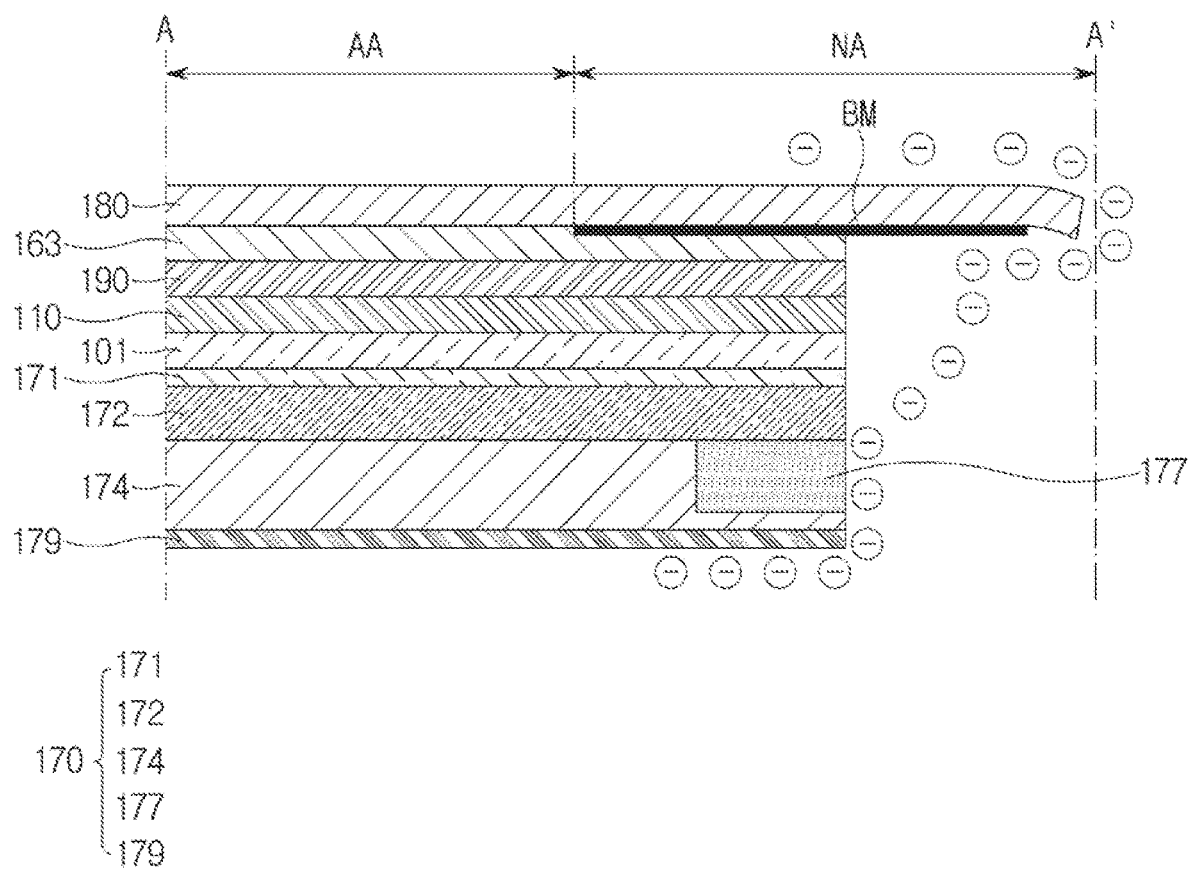
FIG. 11 shows a section taken in A-A' direction of the display panel in FIG. 8 according to another embodiment of the present disclosure.

FIG. 11 shows a section taken in A-A' direction of the display panel in FIG. 8 according to another embodiment of the present disclosure.

Hereinafter, a display panel 100 according to the embodiment of the present disclosure will be explained by referring to FIG. 11.

By referring to FIG. 11, the display panel 100 can include a cover window 180 on an uppermost layer, an adhesive member 163 disposed below the cover window 180, a polarizer 190 disposed below the adhesive member 163 and a panel layer 110 disposed below the polarizer 190. As explained above by referring to FIG. 4, the panel layer 110 can include a flexible substrate and can be bent in a bending area. FIG. 11 is a sectional view taken along A-A' of FIG. 8, and does not fall within an area where a flexible substrate or a panel layer 110 is being bent.

The cover window 180 can be disposed on an uppermost layer of the display panel 100 and be made of a glass or plastic material. The cover window 180 serves as a protection layer protecting internal elements of the display panel 100 and are exposed outside. Therefore, the cover window 180 is contacted with a finger of a user when a user of the display device touches it and then electric charge can occur due to friction. The electric charge occurred by friction and the like can transfer along a side of the cover window 180 and penetrate into the inside of the display panel 100.

The adhesive member 163 is disposed below the cover window 180 and serves to adhere the cover window 180 to the polarizer 190. The adhesive member 163, for example, can be an Optical Clear Adhesive (OCA) or a Pressure Sensitive Adhesive (PSA) and can be of a transparent material.

The polarizer 190 can be formed of a film having a feature of polarization. The polarizer 190 can suppress reflection of external light and reduce reflection feeling when the display device is viewed in the outside. The polarizer 190 can be disposed in the active area (AA).

The panel layer 110 is a layer where a pixel is formed and a transistor including the gate electrode, the source electrode, the drain electrode and the semiconductor layer and the like are formed in the pixel. Further, the panel layer 110 can be a layer where light emitting diodes including the anode electrode, the light emitting layer, the cathode electrode and the like are formed. If frictional charge penetrates into the inside of the panel layer 110 described above, the transistor can have the shift phenomenon and deterioration in the display quality can be caused by the Greenish phenomenon.

The back plate 101 is a firm structure formed below the panel layer 110 and can serve to reinforce rigidity of the panel layer 110. The back plate 101 can be formed of a plastic thin film.

The support member 170 can include the first adhesive layer 171, the first cushion layer 172, the third adhesive layer 174 and the heat dissipation sheet 179. In addition, the support member 170 can further include a conductive tape 177.

The first adhesive layer 171 can be disposed on a rear surface of the back plate 101. The first adhesive layer 171 can include an embossed pattern. The embossed pattern can improve a problem of air bubbles that can be formed therein. The first cushion layer 172 can serve to be pressed and absorb shocks when an external force is given thereto. The first cushion layer 172 can be disposed on a rear surface of the first adhesive layer 171. The third adhesive layer 174 can be disposed on a rear surface of the first cushion layer 172. The third adhesive layer 174 can serve to stick the first cushion layer 172 and the heat dissipation sheet 179 together. The third adhesive layer 174 can be made of the Pressure Sensitive Adhesive (PSA). Further, the third adhesive layer 174 can have conductivity. For example, the third adhesive layer 174 can include a conductive metal ball or a conductive metal wire. The conductive ball or conductive wire can be formed of silver (Ag) material. The conductive tape 177 and the third adhesive layer 174 have conductivity and the heat dissipation sheet 179 can be formed of a metal material. Further, the third adhesive layer 174 can directly contact with the heat dissipation sheet 179. Therefore, the conductive tape 177 can be electrically connected with the heat dissipation sheet 179 through the third adhesive layer 174.

The first cushion layer 172 can fully cover the conductive tape 177 that is disposed below. The first cushion layer 172 can include a light blocking material. The light blocking material can include an ink in black color. For example, the light blocking material can have a color capable of blocking light such as black, dark grey, grey and the like.

The conductive tape 177 can be disposed below the first cushion layer 172. The conductive tape 177 can be covered by the first cushion layer 172. The conductive tape 177 can be disposed on the same layer as the third adhesive layer 174. The conductive tape 177 can be disposed along the outer edges of the cover window 180. For example, the conductive tape 177 can be formed along the outer edges of the cover window 180 of the display panel 100 as explained with reference to FIG. 8. However, since the flexible substrate 111 is configured to be bent at a lower edge of the display panel 100, the conductive tape 177 may not be formed at a lower edge of the display panel 100.

With reference to FIG. 11 again, a height of the conductive tape 177 can be smaller than a height of the third adhesive layer 174. The third adhesive layer 174, for example, can be made of a material such as a Pressure Sensitive Adhesive (PSA). PSA can be a flexible material having viscosity before it is hardened. Therefore, by interposing the conductive tape 177 below the first cushion layer 172 and putting pressure on the heat dissipation sheet 179 by applying the third adhesive layer 174, the third adhesive layer 174 can be hardened. Therefore, the third adhesive layer 174 may be disposed below the conductive tape 177 and between the conductive tape 177 and the heat dissipation sheet 179. Consequently, the third adhesive layer 174 can cover a bottom portion of the conductive tape 177.

The conductive tape 177 can include a conductive material. For example, the conductive tape 177 can include a metallic material. For example, the conductive tape 177 can be formed of silver (Ag) and the like. Therefore, the conductive tape 177 can have conductivity. The conductive tape 177 and the heat dissipation sheet 179 can be electrically connected with each other through the third adhesive layer 174 having conductivity.

The heat dissipation sheet 179 can be disposed below the conductive tape 177 and can be electrically connected with the conductive tape 177. The heat dissipation sheet 179 can serve to dissipate heat. The heat dissipation sheet 179 can be formed of a metallic material such as copper, aluminum and the like to dissipate heat generated in a component, for example, in the driver IC 165 or the circuit element 161. In addition, the heat dissipation sheet 179 can serve as a ground that discharges a frictional charge induced by the conductive tape 177 through gravitation as to be described later on.

A black matrix (BM) can be formed in some areas below the cover window 180. The black matrix (BM) can be formed along edges of the display panel 100. The black matrix (BM) can be formed of a black ink.

According to the embodiment of the present disclosure, the conductive tape 177 having conductivity can be disposed below the first cushion layer 172, and the conductive tape 177 can directly contact with the heat dissipation sheet 179 that includes a metallic material. Thus, the conductive tape 177 can be electrically connected with the heat dissipation sheet 179. Accordingly, frictional charge generated in the cover window 180 can be prompted to be transferred. For example, the conductive tape 177 can be disposed adjacent to the panel layer 110. For example, a thickness of the back plate 101 can be 88 μm and a thickness of the first adhesive layer 171 can be 60 μm, and a thickness of the first cushion layer 172 can be 30 μm. Accordingly, a distance between the conductive tape 177 and the panel layer 110 can be 178 μm. Such a distance is very short and can induce frictional charge by gravitation. In other words, the conductive tape 177 has conductivity and can have gravitation that induces a negative charge. Therefore, frictional charge generated in the cover window 180 can transfer to the conductive tape 177 without penetrating into the panel layer 110. The frictional charge transferred to the conductive tape 177 can be discharged through the heat dissipation sheet 179. Therefore, according to the embodiment, the transistor inside the panel layer 110 may not experience the shift phenomenon and consequently the Greenish phenomenon can be prevented or minimized.

Further, according to the embodiment, the conductive tape 177 may not be recognized from the front of the display panel 100. The support member 170 disposed below a display panel 100 according to prior art is generally formed of a three-layer. For example, the support member 170 according to prior art is configured as a three-layer consisting of the first adhesive layer 171, the first cushion layer 172 and the heat dissipation sheet 179. If applying the conductive tape 177 disclosed by the embodiment to the support member 170 of a three-layer according to prior art, a portion of the first cushion layer 172, which has the same width as the conductive tape 177 should be removed.

In addition, the conductive tape 177 should be disposed in the removed portion. Further, the conductive tape 177 can be prevented from being covered by the first cushion layer 172.

Therefore, if applying the related art, from the front surface of display panel, the conductive tape can be recognized and that may cause a limitation. Such a limitation can occur even if the black matrix is disposed thereupon.

To address this limitation associated with the related art, the embodiment of the present disclosure can configure the support member 170 as a four-layer consisting of the first adhesive layer 171, the first cushion layer 172, the third adhesive layer 174 and the heat dissipation sheet 179. In other words, the first cushion layer 172 disposed upon the conductive tape 177 can be formed to fully cover the conductive tape 177 according to the embodiment of the present disclosure. In addition, as described above, the first cushion layer 172 can include the light blocking material. Therefore, the limitation of the conductive tape 177 being recognized from the front of the display panel 100 can be resolved or addressed.

Figure 12:
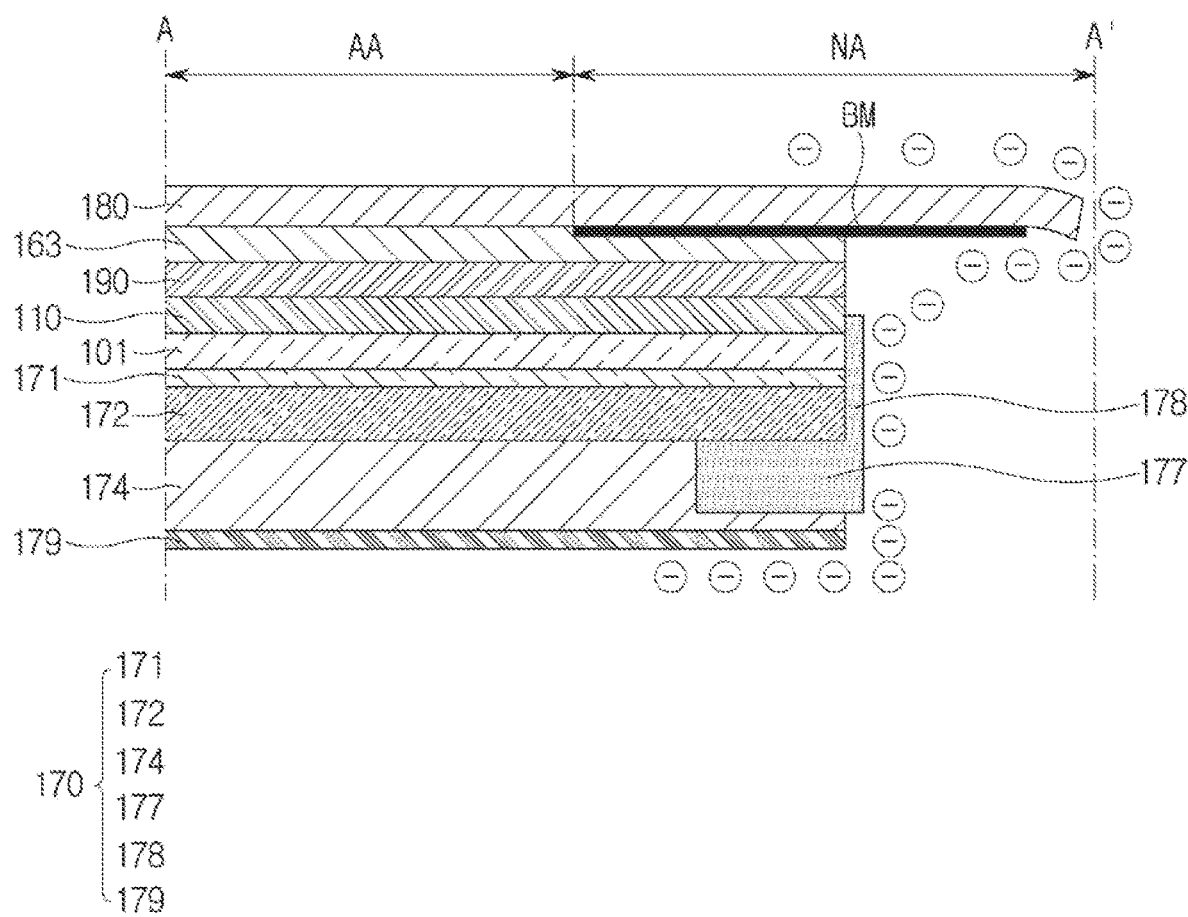
FIG. 12 is a modification of the embodiment of FIG. 11 and shows a section taken in A-A' direction of the display panel in FIG. 8.

FIG. 12 is a modification of the embodiment of FIG. 10 and shows a section taken in A-A' direction of the display panel in FIG. 8.

Referring to FIG. 12, a modification of the embodiment of FIG. 10 will be explained hereinafter. Further, in describing FIG. 12, descriptions that are redundant with what are mentioned above will be omitted or may be briefly discussed.

Referring to FIG. 12, the conductive tape 177 can further include a vertical portion 178 that protrudes outwards and is formed in a vertical direction along a side of the first cushion layer 172.

The vertical portion 178 can protrude from the conductive tape 177 and extend in a direction towards the panel layer 110. For example, the vertical portion 178 can be attached on a side of the first cushion layer 172, a side of the first adhesive layer 171 and a side of the panel layer 110.

According to the embodiment of the present disclosure, the vertical portion 178 can be formed to extend from the conductive tape 177 and can be formed of the same material as the conductive tape 177. In other words, the vertical portion 178 can include a metallic material. For example, the vertical portion 178 can be formed of silver (Ag). The vertical portion 178 can extend in a direction towards the panel layer 110. Accordingly, the vertical portion 178 can let frictional charge generated in the cover window 180 be effectively induced to the conductive tape 177. Further, if the vertical portion 178 is formed to fully cover a side of the panel layer 110, an efficiency to block frictional charge attempting to penetrate into the panel layer 110 can improve.

Figure 13:
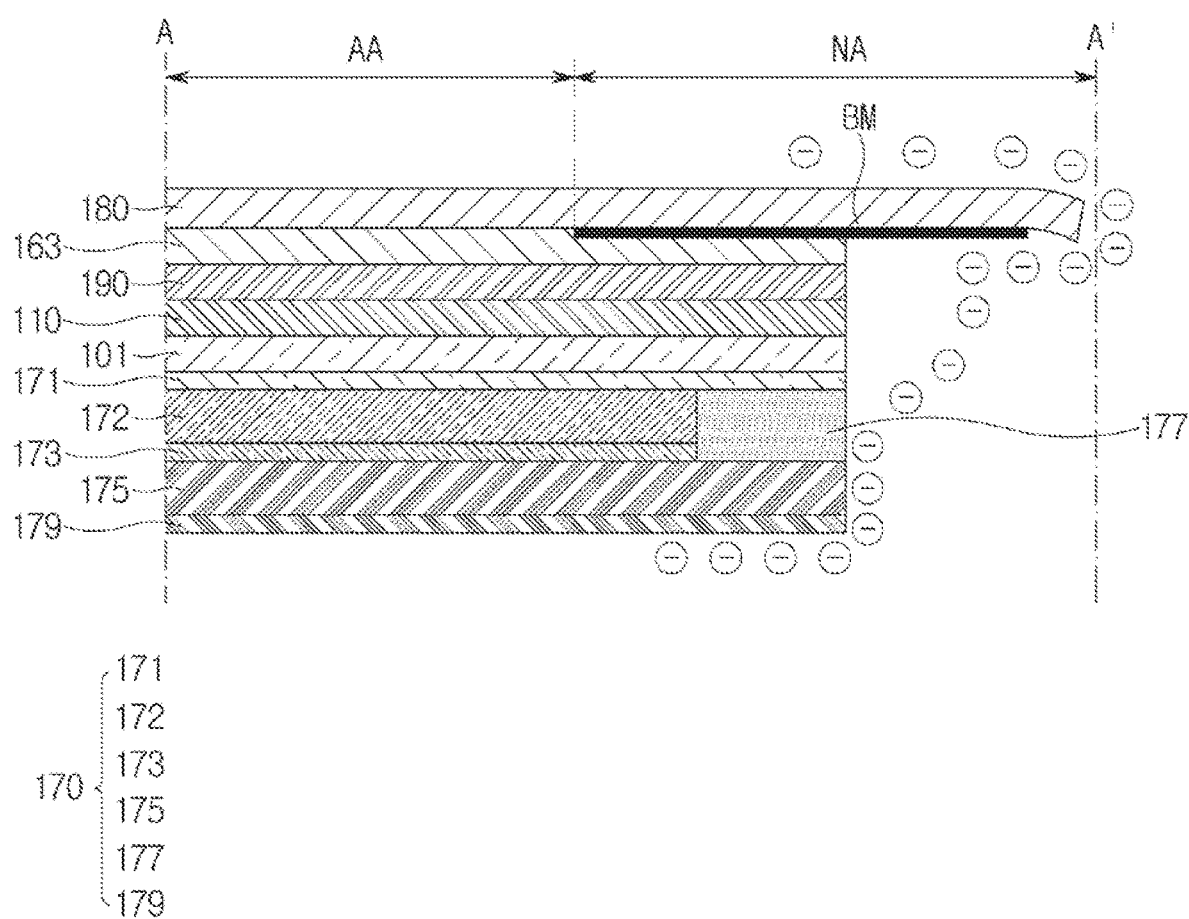
FIG. 13 shows a section taken in A-A' direction of the display panel in FIG. 8 according to another embodiment of the present disclosure.

FIG. 13 shows a section taken in A-A' direction of the display panel in FIG. 8 according to the embodiment of the present disclosure.

Hereinafter, a display panel 100 according to the embodiment of the present disclosure will be explained by referring to FIG. 13.

By referring to FIG. 13, a display panel 100 can include a cover window 180 on an uppermost layer, an adhesive member 163 disposed below the cover window 180, a polarizer 190 disposed below the adhesive member 163 and a panel layer 110 disposed below the polarizer 190. As explained above by referring to FIG. 4, the panel layer 110 can include a flexible substrate and can be bent in a bending area. FIG. 13 is a sectional view taken along A-A' of FIG. 8, and does not fall within an area where a flexible substrate or a panel layer 110 is being bent.

The cover window 180 can be disposed on an uppermost layer of the display panel 100 and can be made of a glass or plastic material. The cover window 180 serves as a protection layer protecting internal elements of the display panel 100 and are exposed outside. Therefore, the cover window 180 is contacted with a finger of a user when a user of the display device touches it and then electric charge can occur due to friction. The electric charge occurred by friction and the like can transfer along a side of the cover window 180 and penetrate into the inside of the display panel 100.

The adhesive member 163 is disposed below the cover window 180 and serves to adhere the cover window 180 to the polarizer 190. The adhesive member 163, for example, can be an Optical Clear Adhesive (OCA) or a Pressure Sensitive Adhesive (PSA) and can be of a transparent material.

The polarizer 190 can be formed of a film having a feature of polarization. The polarizer 190 can suppress reflection of external light and reduce reflection feeling when the display device is viewed in the outside. The polarizer 190 can be disposed in the active area (AA).

The panel layer 110 is a layer where a pixel is formed and a transistor including the gate electrode, the source electrode, the drain electrode and the semiconductor layer and the like are formed in the pixel. Further, the panel layer 110 can be a layer where light emitting diodes including the anode electrode, the light emitting layer, the cathode electrode and the like are formed. If frictional charge penetrates into the inside of the panel layer 110 described above, the transistor may have the shift phenomenon and a possible deterioration in the display quality may be caused by the Greenish phenomenon.

The back plate 101 is a firm structure formed below the panel layer 110 and can serve to reinforce rigidity of the panel layer 110. The back plate 101 can be formed of a plastic thin film.

The support member 170 can include the first adhesive layer 171, the first cushion layer 172, the second adhesive layer 173, the second cushion layer 175 and the heat dissipation sheet 179. In addition, the support member 170 can further include a conductive tape 177.

The first adhesive layer 171 can be disposed on a rear surface of the back plate 101. The first adhesive layer 171 can include an embossed pattern. The embossed pattern can improve a problem of air bubbles that can be formed therein.

The first cushion layer 172 can serve to be pressed and absorb shocks when an external force is given thereto. The first cushion layer 172 can be disposed on a rear surface of the first adhesive layer 171. The second adhesive layer 173 can be disposed on a rear surface of the first cushion layer 172. The second adhesive layer 173 can serve to stick the first cushion layer 172 and the second cushion layer 175 together. The second adhesive layer 173, for example, can include a double-sided tape.

The second cushion layer 175 can be disposed below the second adhesive layer 173 and the conductive tape 177. In addition, the second cushion layer 175 can fully cover the conductive tape 177 that is disposed on the second cushion layer 175. The second cushion layer 175 can include a light blocking material. The light blocking material can include an ink in black color. For example, the light blocking material can have a color capable of blocking light such as black, dark grey, grey and the like.

Further, the second cushion layer 175 can include a conductive material. For example, the second cushion layer 175 can be configured of a conductive foam pad. The second cushion layer 175 can be attached to the conductive tape 177 disposed upon the second cushion layer 175. Further, the second cushion layer 175 can contact with the heat dissipation sheet 179 disposed below the second cushion layer 175. Therefore, the conductive tape 177 can be electrically connected with the heat dissipation sheet 179 through the conductive second cushion layer 175.

The conductive tape 177 can be attached to the second cushion layer 175 disposed below the conductive tape 177. The second cushion layer 175 can fully cover a bottom portion of the conductive tape 177. The conductive tape 177 can be disposed on the same layer as the first cushion layer 172. The conductive tape 177 can be disposed along the outer edges of the cover window 180. For example, the conductive tape 177 can be formed along the outer edges of the cover window 180 of the display panel 100 as explained with reference to FIG. 8. However, since the flexible substrate 111 is configured to be bent at a lower edge of the display panel 100, the conductive tape 177 may not be formed at a lower edge of the display panel 100.

With reference to FIG. 13 again, a height of the conductive tape 177 can be equal to a sum of a height of the first cushion layer 172 and a height of the second adhesive layer 173. For example, after the first cushion layer 172 and the second adhesive layer 173 are formed, a portion with a pre-defined width of the first cushion layer 172 and the second adhesive layer 173 respectively can be removed, and the conductive tape 177 can be disposed in the removed portion.

The conductive tape 177 can include a conductive material. For example, the conductive tape 177 can include a metallic material. For example, the conductive tape 177 can be formed of silver (Ag) and the like. Therefore, the conductive tape 177 can have conductivity. The conductive tape 177 can directly contact with the second cushion layer 175. In addition, the second cushion layer 175 can have conductivity. Further, the second cushion layer 175 can directly contact with the heat dissipation sheet 179. Accordingly, the conductive tape 177 and the heat dissipation sheet 179 can be electrically connected with each other through the second cushion layer 175.

The heat dissipation sheet 179 can be disposed below the conductive tape 177 and can be electrically connected with the conductive tape 177. The heat dissipation sheet 179 can serve to dissipate heat. The heat dissipation sheet 179 can be formed of a metallic material such as copper, aluminum and the like to dissipate heat generated in a component, for example, in the driver IC 165 or the circuit element 161. In addition, the heat dissipation sheet 179 can serve as a ground that discharges a frictional charge induced by the conductive tape 177 through gravitation as to be described later on.

A black matrix (BM) can be formed in some areas below the cover window 180. The black matrix (BM) can be formed along edges of the display panel 100. The black matrix (BM) can be formed of a black ink.

According to the embodiment of the present disclosure, the second cushion layer 175 having conductivity can directly contact with the conductive tape 177 and can directly contact with the heat dissipation sheet 179. Accordingly, the conductive tape 177 can be electrically connected with the heat dissipation sheet 179. Consequently, frictional charge generated in the cover window 180 can be prompted to be transferred. For example, the conductive tape 177 can be disposed adjacent to the panel layer 110. For example, a thickness of the back plate 101 can be 88 μm and a thickness of the first adhesive layer 171 can be 60 μm. Accordingly, a distance between the conductive tape 177 and the panel layer 110 can be 148 μm. Such a distance is very short and can induce frictional charge by gravitation. In other words, the conductive tape 177 has conductivity and can have gravitation that induces a negative charge. Therefore, frictional charge generated in the cover window 180 can transfer to the conductive tape 177 without penetrating into the panel layer 110. The frictional charge transferred to the conductive tape 177 can transfer to the heat dissipation sheet 179 through the second cushion layer 175 and be discharged. Therefore, according to the embodiment, the transistor inside the panel layer 110 may not experience the shift phenomenon and consequently the Greenish phenomenon can be prevented.

Further, according to the embodiment, the conductive tape 177 can be less recognized from the front of the display panel 100. In other words, according to the embodiment of the present disclosure, below the conductive tape 177, the second cushion layer 175 including the light blocking material can be disposed to fully cover the conductive tape 177. Therefore, when viewed from the front of the display panel 100, reflection feeling by the conductive tape 177 can be reduced since the light blocking material is applied fully below the conductive tape 177.

FIG. 14 is a modification of the embodiment of FIG. 13 and shows a section in A-A' direction of the display panel in FIG. 8.

With reference to FIG. 14, a modification of the embodiment of FIG. 13 will be explained. Further, in describing FIG. 14, descriptions that are redundant with what are mentioned above will be omitted or may be briefly described.

With reference to FIG. 14, the conductive tape 177 can further include a vertical portion 178 that protrudes outwards and is formed in a vertical direction along a side of the first cushion layer 172.

The vertical portion 178 can protrude from the conductive tape 177 and extend in a direction towards the panel layer 110. For example, the vertical portion 178 can be attached on a side of the back plate 101 and a side of the panel layer 110.

According to the embodiment of the present disclosure, the vertical portion 178 can be formed to extend from the conductive tape 177 and can be formed of the same material as the conductive tape 177. In other words, the vertical portion 178 can include a metallic material. For example, the vertical portion 178 can be formed of silver (Ag). The vertical portion 178 can extend in a direction towards the panel layer 110. Accordingly, the vertical portion 178 can let frictional charge generated in the cover window 180 be effectively induced to the conductive tape 177. Further, if the vertical portion 178 is formed to fully cover a side of the panel layer 110, an efficiency to block frictional charge attempting to penetrate into the panel layer 110 can improve.

Those skilled in the art can understand that the present disclosure described herein can be implemented in other concrete forms without departing from the technical concept or essential features thereof. Thus, it should be understood that embodiments described hereinabove are examples in all aspects, and do not limit the present disclosure. The scope of the present disclosure will be denoted by the claims that are provided hereinbelow, rather than the detailed description. In addition, it should be construed that all modifications or variations that are derived from the meaning, scope and the concept of equivalence of the claims are covered in the scope of the present disclosure.

What is claimed is:

1. A display panel comprising:
   a cover window;
   a panel layer disposed below the cover window; and
   a support member disposed below the panel layer,
   wherein the support member comprises:
      a first adhesive layer;
      a first cushion layer disposed below the first adhesive layer;
      a conductive tape disposed below the first cushion layer, covered by the first cushion layer and including a conductive material; and
      a heat dissipation sheet disposed below the conductive tape and electrically connected with the conductive tape.

2. The display panel according to claim 1, wherein the first cushion layer comprises a light blocking material.

3. The display panel according to claim 1, wherein the conductive tape is electrically connected with the heat dissipation sheet by directly contacting with the heat dissipation sheet.

4. The display panel according to claim 1, further comprising:
   a second adhesive layer disposed below the first cushion layer; and
   a second cushion layer disposed below the second adhesive layer.

5. The display panel according to claim 1, wherein the conductive tape further comprises a vertical portion protruding outwards and formed vertically along a side of the first cushion layer.

6. The display panel according to claim 2, further comprising:
   a third adhesive layer disposed below the first cushion layer, covering a bottom portion of the conductive tape and directly contacting with the heat dissipation sheet.

7. The display panel according to claim 6, wherein the third adhesive layer comprises a conductive material, and wherein the conductive tape is electrically connected with the heat dissipation sheet through the third adhesive layer.

8. The display panel according to claim 6, wherein the conductive tape further comprises a vertical portion protruding outwards and formed vertically along a side of the first cushion layer.

9. The display panel according to claim 1, further comprising:
   an adhesive member disposed between the cover window and the panel layer;
   a polarizer disposed between the adhesive member and the panel layer; and
   a back plate disposed between the panel layer and the first adhesive layer.

10. A display panel comprising:
    a cover window;
    a panel layer disposed below the cover window; and
    a support member disposed below the panel layer,
    wherein the support member comprises:
       a first adhesive layer;
       a first cushion layer disposed below the first adhesive layer;
       a conductive tape disposed below the first adhesive layer and comprising a conductive material;
       a second adhesive layer disposed below the first cushion layer;
       a second cushion layer disposed below the second adhesive layer and the conductive tape, and covering a bottom portion of the conductive tape; and
       a heat dissipation sheet disposed below the second cushion layer.

11. The display panel according to claim 10, wherein the second cushion layer comprises a light blocking material.

12. The display panel according to claim 10, wherein the second cushion layer comprises a conductive material, and the conductive tape is electrically connected with the heat dissipation sheet through the second cushion layer.

13. The display panel according to claim 12, wherein the conductive tape further comprises a vertical portion protruding outwards and formed vertically along a side of the panel layer.

14. The display panel according to claim 10, further comprising:
    an adhesive member disposed between the cover window and the panel layer;
    a polarizer disposed between the adhesive member and the panel layer; and
    a back plate disposed between the panel layer and the first adhesive layer.

15. The display panel according to claim 10, further comprising a black matrix formed below the cover window and overlapping the conductive tape.

* * * * *